(12) United States Patent
Feldman

(10) Patent No.: US 7,586,103 B2
(45) Date of Patent: Sep. 8, 2009

(54) HIGH REFRACTIVE INDEX FLUIDS FOR IMMERSION LITHOGRAPHY

(75) Inventor: Jerald Feldman, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 171 days.

(21) Appl. No.: 11/759,996

(22) Filed: Jun. 8, 2007

(65) Prior Publication Data

US 2008/0061248 A1 Mar. 13, 2008

Related U.S. Application Data

(60) Provisional application No. 60/843,286, filed on Sep. 9, 2006.

(51) Int. Cl.
*G03B 27/42* (2006.01)
(52) U.S. Cl. .............................. 250/432 R; 250/505.1; 250/492.22; 355/687; 556/482
(58) Field of Classification Search ........................ None
See application file for complete search history.

(56) References Cited

U.S. PATENT DOCUMENTS 5,175,332 A * 12/1992 Chatterton et al. .......... 556/482

7,391,501 B2 * 6/2008 Deng et al. .................... 355/67
2005/0119371 A1 6/2005 Drzal et al.
2005/0164502 A1 7/2005 Deng et al.
2005/0173682 A1 8/2005 Zhang et al.

FOREIGN PATENT DOCUMENTS

WO 2005/117074 A1 8/2005

OTHER PUBLICATIONS

Feiring et al., Design of Very Transparent Fluoropolymer Resists for Semiconductor Manufacture at 157 nm, Journal of Fluorine Chemistry, 2003, pp. 11-16, vol. 122, Issue 1.
Thompson et al., Introduction to Microlithography, 2nd Edition, American Chemical Society, Washington, DC, 1994 (Book not Included).
Schott et al., Z. Anorg. Allg. Chem., 429, 1979, pp. 177-186.
Crawford et al., Single Layer Flyoropolymer Resists for 157 nm Photolithography at 157 nm Exposure Wavelength, Advances in Resist Technology and Processing XVIII, SPIE, vol. 5039, 2003.

* cited by examiner

*Primary Examiner*—David A. Vanore
(74) *Attorney, Agent, or Firm*—Gail D. Tanzer

(57) ABSTRACT

Provided are compositions suitable for use as immersion liquids in immersion lithography, and immersion lithography processes and apparatus for using the compositions.

2 Claims, 3 Drawing Sheets

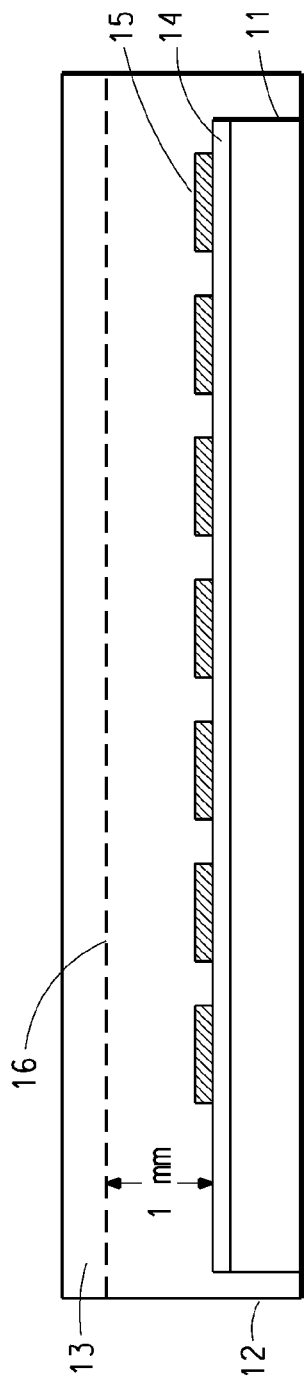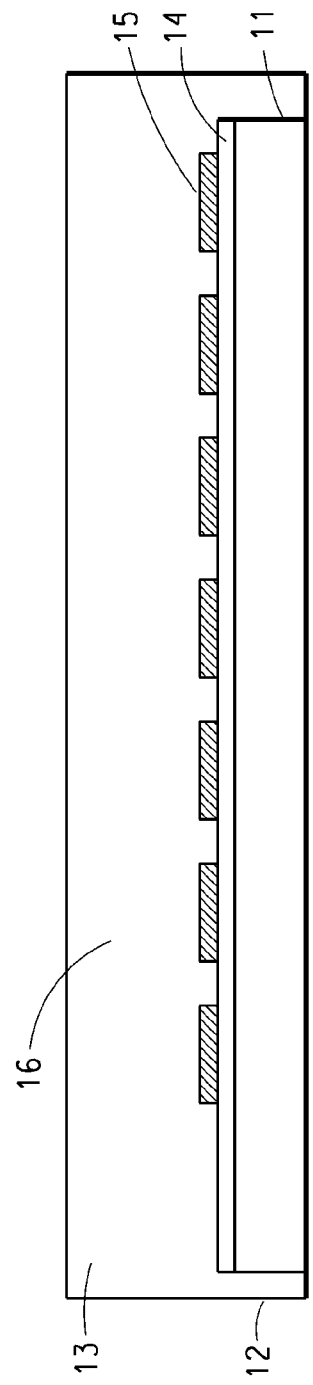

HIGH REFRACTIVE INDEX FLUIDS FOR IMMERSION LITHOGRAPHY

FIELD OF THE INVENTION

Figure 1:
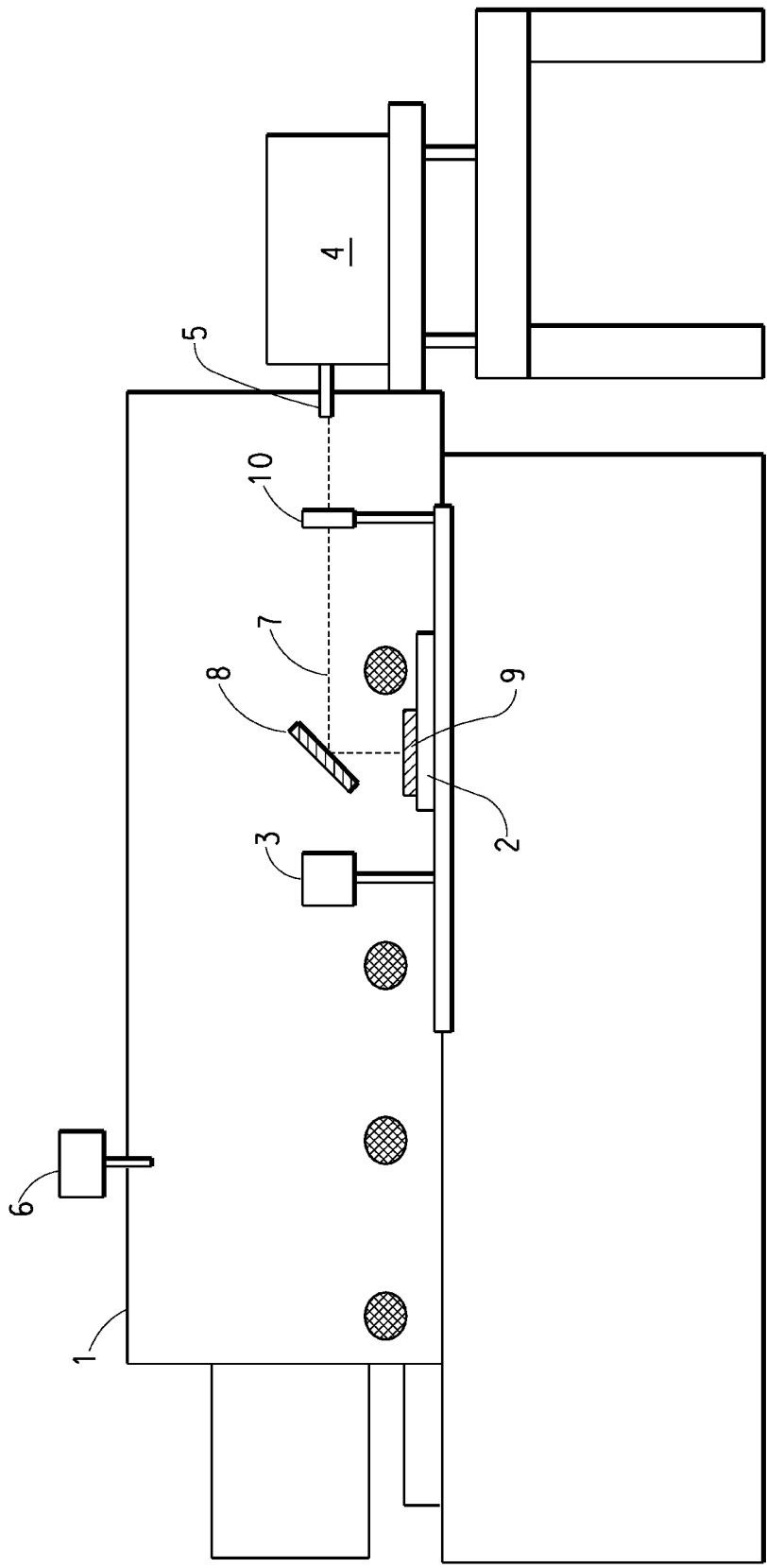

The present invention is directed to liquid compositions suitable for use as immersion liquids in immersion lithography, and to immersion lithography processes and apparatus.

BACKGROUND

Immersion lithography is a technique whereby a liquid of high refractive index and high transparency fills the air gap between the optical system's projection lens and the silicon wafer target, thereby enabling finer feature sizes to be printed onto the photoresist-coated silicon wafer.

Water, with a refractive index of 1.44, is in commercial use as an immersion liquid. One approach to obtaining higher refractive index is to combine water with other substances, as described, for example, in Zhang et al., U.S. Published Patent Application 2005/0173682.

Wheland et al., U.S. Published Patent Application 2005/119371, discloses use in immersion lithography of high transparency alkanes having refractive indices in the range of 1.5-1.7.

Deng et al., U.S. Published Patent Application 2005/0164502, discloses use of siloxane polymers and oligomers as immersion medium in immersion lithography.

Taku et al., WO2005/117074, discloses siloxane liquids for use as immersion liquids having refractive index of ca. 1.55 at 193 nm, and represented by the formula:

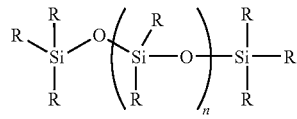

where R is a hydrocarbon or halogenated hydrocarbon radical having 1-8 carbons, and n ranges from 0-40 but is preferably 0.

Schott et al., Z. anorg. allge. Chem, 459, pp. 177-186 (1979) discloses dialkoxy and trialkoxy silanols.

The only materials than have been identified to date that fulfill the need for refractive index at 193 nm of greater than 1.6 and high transparency are some saturated cyclic hydrocarbons; e.g. cyclooctane, bicyclohexyl, decahydronaphthalene, and the like. Although they have high index, these materials appear to have an upper index limit of approximately 1.65 at 193 nm. Moreover, the range of available or easy to synthesize structures is limited. Thus, there remains a need for easy to synthesize compositions that provide higher index of refraction at 193 nm and high transparency.

SUMMARY OF THE INVENTION

The present invention provides a process comprising causing UV radiation having a wavelength from about 170 to about 260 nm to imagewise illuminate a target surface upon at least a portion of which surface is disposed a liquid comprising compound represented by the formula

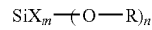

wherein X is halogen, n=1 to 4, m=4−n; and, R is cycloalkyl.

The present invention further provides an apparatus comprising a light source capable of emitting light having a wavelength from about 170 to about 260 nm, a surface disposed so that upon activation of the light source the surface is imagewise illuminated by the light emitted from the light source, wherein upon at least a portion of the surface is disposed a liquid comprising compound represented by the formula

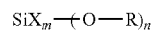

wherein X is halogen, n=1 to 4, m=4−n; and, R is cycloalkyl.

DETAILED DESCRIPTION

Silanols are transparent to UV light at 193 nm. The cycloalkoxysilanes formed therefrom have been found to exhibit a refractive index greater than the components from which they are formed. Coupled with high transparency, cycloalkoxysilanes are highly suitable for use as immersion liquids in immersion lithography.

The term "cycloalkoxysilane" as used herein refers to a group of chemical compositions represented by the formula

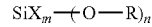

wherein X is halogen, n=1 to 4, m=4−n; and, R is cycloalkyl.

The terms "imaging," "imaging applications," "imagewise", as used herein, refer to formation of an image on a substrate by a photoactivated process. There is no limitation on the shape of the image formed, and the image can include a completely masked and/or a completely unmasked surface. The terms "light" and "radiation" are used herein interchangeably to refer to non-ionizing electromagnetic radiation in the wavelength range from 170-260 nanometers, most particularly at 193 and 248 nm, and are not intended to include ionizing radiation.

Both liquid and solid cycloalkoxysilanes are suitable. Liquid cycloalkoxysilanes range in viscosity from water-like to paste-like. In some embodiments, a viscous liquid or solid cycloalkoxysilane can be dissolved in a low viscosity solvent, preferably of comparable refractive index. In one embodiment, the solvent is the cycloalkane corresponding to the cycloalkoxy group in the silanol.

The cycloalkoxy moiety comprises one or more cyclobutane or larger rings of any size, with or without branches, and can be interconnected in any fashion including linear, fused, bicyclic, polycyclic, and spiro arrangements.

Preferably, the cycloalkoxy moiety is one in which the corresponding alkane exhibits low absorbance in the UV, high photochemical stability, and inherently high refractive index. Preferred cycloalkoxys include cyclobutoxy, cyclobutylmethoxy, cyclopentoxy, cyclohexoxy, cycloheptoxy, cyclooctoxy, decahydronaphthoxy racemate, cis-decahydronaphthoxy, trans-decahydronaphthoxy, exo-tetrahydrodicyclopentadienoxy, 1,1'-bicyclohexoxy, 2-ethylnorbornoxy, n-octyl-cyclohexoxy, octahydroindenoxy, and mixtures thereof.

Compounds of the type $Si(OR)_3Cl$ or $Si(OR)_4$ are prepared by contacting $SiCl_4$ with 3 or 4 molar equivalents of a solution of a cycloalkanol, ROH, where R is a cycloalkyl, in an organic solvent in the presence of 3 or 4 equivalents of an organic base, especially amine or pyridine bases. Suitable solvents include but are not limited to benzene, toluene, dichloromethane, diethylether, tetrahydrofuran, and mixtures thereof. The reactions can be carried out at room temperature, but can optionally be heated above room temperature. After removal of precipitated chloride—in one embodiment, pyridinium hydrochloride—by filtration, the filtrates are concentrated to dryness and the resulting $Si(OR)_3Cl$ or $Si(OR)_4$ compounds purified by the combination of methods provided herein to achieve desirably low absorbance at 193 nm.

Mixed alkoxide compounds can be prepared. In one embodiment, contacting $Si(OR)_3Cl$ prepared as described supra with 1 equivalent of a second alcohol R'OH in the presence of 1 equivalent of base results in $Si(OR)_3(OR')$. In another embodiment, contacting $Si(OR)_2Cl_2$ with 2 equivalents of a second alcohol R'OH in the presence of 2 equivalents of base produces $Si(OR)_2(OR')_2$.

Compounds of the type $Si(OR)_2Cl_2$ where R is a secondary alkyl group (e.g. cyclohexyl) can be prepared by contacting $SiCl_4$ with 2 equivalents of the alcohol at low temperature. When R is a tertiary alkyl (e.g. t-butyl), $Si(OR)_2Cl_2$ is prepared by contacting $SiCl_4$ with 2 equivalents of ROH in the presence of a base such as pyridine.

Cyclohexanol and cyclopentanol are available commercially in highly purified grades (>99%). Application to immersion lithography requires high transparency as well as the inherently high refractive index of alkoxy silanol compounds. Alkoxy silanol compounds suitable for use in immersion lithography are desirably as free as possible from light-absorbing impurities such as unsaturated species including olefins, aromatics, and ketones. In general, even highly pure commercially available grades of starting materials often contain undesirably high quantities of absorbing impurities.

In order to prepare the alkoxy silanol compounds, highly pure alkanols and $SiCl_4$ in highly pure solvents are used. Following synthesis, excess solvent is desirably completely removed, and any other impurities that absorb 193 nm light minimized.

Disclosed herein are methods of purification that when employed together can result in alkoxy silanols characterized by absorbance at 193 nm of $\leq 1$ cm$^{-1}$.

Some organic impurities are orders of magnitude more absorbing than other organic impurities. The concentration of more highly absorbing contaminants, such as olefins and carbonyls, needs to be on the order of 1 ppm or even less.

Highly absorbing contaminants can be removed from the alkoxy silanols by combinations of fractional distillation, sparging, freeze-thaw cycling, zone refining, and treatment with adsorbents such as molecular sieves of various pore sizes, carbon, silica gel, alumina, or mixtures thereof.

Distillation is desirably performed in the cleanest, least contaminated distillation apparatus possible. It is particularly desirable to exclude oxygen and any adventitious or systemic organic contaminants. It has been found that the use of grease, including fluorinated greases, such as are commonly used in distillation and vacuum systems to provide improved sealing and easier part removal can contaminate the distillate herein sufficiently to actually degrade the absorbance. It is therefore highly preferable to perform the distillation in a "grease-free" distillation system. "Grease-free", as used herein, means that no grease is employed when assembling the cleaned parts of the system. One of skill in the art will appreciate that the term "grease-free" does not mean that the invention is not operable should there be some small amount of grease contamination somewhere in the system. "Grease-free" is not intended to require the complete absence of any grease in no matter how small a concentration, but rather to emphasize the importance of eliminating grease to the greatest extent possible.

Silica gel and zeolite adsorbents are most effective if activated, preferably by heating while purging with a dry gas flow. It is preferable that adsorbent activation be done immediately prior to use. Activation can be achieved by heating to about 200 to 500° C. under a flow of dry, pure air, nitrogen, or helium for several hours. Air at 500° C. has the advantage of burning most residual organic contaminants off an adsorbent such as a silica gel or a zeolite. The gas flow can be continued as the system cools down to a temperature in the range of room temperature to 100° C. In an alternative procedure the gas flow is stopped and the system sealed off. In another alternative procedure, the gas flow is stopped and the system evacuated as the adsorbent cools to a temperature in the range of room temperature to 100° C. The advantage of stopping the gas flow while the adsorbent is at 500° C. is that this minimizes recontamination from any adventitious impurities in the gas as the adsorbent cools down.

A preferred method of activating the silica gel and zeolite adsorbents is the following. A Hastelloy® tube in a clamshell furnace is loaded with adsorbent and then heated under an air flow for two hours at 500° C. The airflow is stopped and the Hastelloy tube immediately sealed at both ends. Once the sealed Hastelloy® tube has cooled to room temperature, it is transferred to a $N_2$ glove bag where the tube is opened and the adsorbent added to a bottle containing alkane liquid that is to be purified. Although the ratio of adsorbent to liquid can be varied without limit, it has been found satisfactory to employ one volume of adsorbent for every 1 to 20 volumes of liquid. The amount of adsorbent required will depend upon the level of contamination in the as-received liquid. It is therefore well advised to employ some excess to insure maximum effectiveness in removal of contaminants.

Sparging is a suitable method for removing free oxygen from alkoxy silanols. One method for sparging that can be used is as follows: A glove box is supplied with dry, low-oxygen-content nitrogen such as 99.998% or higher nitrogen, sold as a cylinder gas by Matheson or by the boil-off of liquid nitrogen. A liquid aliquot of about 10 ml is placed in a 20 ml glass scintillation vial. The sample is transferred into the nitrogen purged dry box. The vial is secured flat on the work surface; the plastic cap is removed from the vial, a disposable glass pipette lowered into the solvent and then nitrogen delivered via the pipette from the same dry, low-oxygen source as the glove box. Flow rate is adjusted to maintain vigorous bubbling of solvent short of causing the solvent to splash out of the vial. Vigorous sparging is continued for 30-60 seconds, long enough to significantly decrease oxygen content and possibly water content.

An alternative method for purifying an alkoxy silanol is bulb-to-bulb distillation through a bed of 3 A molecular sieves. For example, two flasks are connected by a tube containing 3 A molecular sieves preheated as described above. One of the flasks is then partially filled with the liquid that is to be purified and the system resealed. The liquid is subjected to three freeze/thaw cycles to remove dissolved oxygen. The system is then thoroughly evacuated after refreezing the liquid with liquid nitrogen. The system is sealed under vacuum and the liquid nitrogen-cooling bath transferred from the flask containing the liquid to the empty flask. As the liquid warms towards room temperature it distills through the bed of 3A molecular sieves to the chilled flask. Once distillation is complete the vacuum is relieved with oxygen free nitrogen, the purified liquid is allowed to warm to room temperature, and the flask then valved off for subsequent use.

From the standpoint of practical utility, it is highly desirable to remove contaminating species that exhibit photochemical reactivity. Such species not only tend to be strongly absorbing in the wavelength region from 170 to 260 nm, but also can undergo photo-induced reactions, often resulting in bubble formation and darkening of the immersion liquid. Extraction of any one photochemically active species is beneficial whether or not any other photochemically active species present is extracted.

When the immersion liquid damages the resist, a topcoat may be necessary. A suitable topcoat is preferably substantially transparent in the range of 170-260 nm wavelength, particularly at 193 and 248 nm, photochemically inert within that wavelength range, substantially insoluble in the immersion liquid, and soluble in solvents in which the photoresist is insoluble. Thus, the substrate is spin-coated with a photoresist, the coated substrate is spin-coated with a topcoat, and the spin-coated substrate is contacted with a suitable alkoxy silanol. Photoimaging can then be carried out, the topcoat removed by dissolution in a solvent that does not dissolve or swell the photoresist, and the photoresist developed according to methods known to those skilled in the art.

At times a suitable alkoxy silanol is subject to repeated exposure to intense bursts of laser light, and is in contact with other surfaces that, however, clean, may still contain some contamination. Both these effects can be deleterious over time to the absorbance of the alkoxy silanol. It may be desirable therefore to recycle the alkoxy silanol so that it can be restored to absorbance below 1 $cm^{-1}$. Recycling can be effected through adsorbents such as those recited supra, preferably under inert gas. Recycling and regeneration can be accomplished batch-wise or continuously.

Three embodiments are contemplated within the framework of immersion photolithography at 193 and 248 nm exposure wavelengths. These are contact, proximity, and projection immersion photolithography. In projection immersion photolithography, the index of refraction of the liquid has the effect of providing an effective reduction in the wavelength of the incident laser light where $\lambda_{immersion\ liquid} = \lambda_{vacuum}/n_{immersion\ liquid}$ where $\lambda$ is the wavelength of the laser light in the immersion liquid or vacuum respectively and n is the index of refraction of the immersion liquid. The effective reduction of the exposure wavelength results in improved image resolution and smaller attainable features.

In one embodiment 193 nm radiation from, for example an ArF excimer laser, is transmitted through a photomask, typically comprising a chrome metal circuit diagram patterned on glass by electron beam imaging, forming an image of the circuit pattern on a photoresist. Numerous materials for use as photoresists are well known in the art and are in widespread commercial use. All such materials are suitable for use with the fluid disclosed herein, so long as they are sensitive to 193 nm light and are substantially insoluble in the alkane or can be protected from dissolution by a topcoat. Suitable photoresist compositions are described in *Introduction to Microlithography*, Second Edition by L. F. Thompson, C. G. Willson, and M. J. Bowden, American Chemical Society, Washington, D.C., 1994. Examples of suitable photoresists include the 193 nm Epic Resists from Rohm and Haas Electronic Materials, (Marlborough, Mass.), or other resists from companies such as TOK (OHKA AMERICA, INC. Headquarters/Hillsboro, Oreg. or AZ Electronic Materials, Somerville, N.J.

Both positive-working photoresists, such as Rohm and Haas's Epic 2200 and negative-working photoresists such as Rohm and Haas's UVN30 are suitable for use in the immersion photolithography process. A positive-working photoresist is one wherein the regions exposed to light are rendered soluble in the developer while the unexposed regions are insoluble therein. A negative-working photoresist is one wherein the regions exposed to light are rendered insoluble in the developer while the regions unexposed to light are soluble therein.

A photoresist, when imagewise exposed to light, forms what is called a latent image. In one embodiment of a process of the invention, a chemically amplified, positive resist containing a photoacid generator (PAG), is employed. The photoresist layer comprising the latent image is subject to a post exposure bake (PEB) step for typically 60 seconds at temperatures between 90 and 140° C. in air. After this PEB step, the photoresist coated wafer is then put into an aqueous base developer, such as a 0.26 Normal TMAH developer, whereby the exposed regions of the polymer film are developed away, and the patterned photoresist is observed.

In characterizing the behavior of a photoresist used in a photolithographic process, two useful exposure parameters employed in the art are $E_0$, the open grid exposure dose required to clear the photoresist, and $E_1$, the minimum dose required to produce the desired image. $E_0$ is sometimes called the clearing dose, and $E_1$, the sizing dose, for achieving features of the correct size.

While there is no particular limitation on the thickness of the photoresist layer, in the typical practice of the present invention the photoresist coating will be 150 nm to 200 nm in thickness on a silicon wafer substrate. This thickness is determined by the desired minimum feature sizes to be printed. For the purpose of illustration of this concept, but in no way limiting on the scope of application the invention, using an aspect ratio of 3-4, a typical value in the semiconductor art, if the desired features are 65 nm in width, the film thickness should be ~195 nm. In general, the thicker the photoresist layer, the better resistance to dry etch processes in subsequent processing of the patterned photoresist layer.

The presence of a topcoat does not materially alter the operability of the immersion photolithography. Suitable topcoats include, but are not limited to, highly transparent fluoropolymers, which are soluble in fluorinated solvents, which fluorinated solvents in turn are not solvents for the photoresist polymers. Particularly preferred are amorphous perfluoropolymers such as Teflon® AF, available from DuPont. In a typical application, an amorphous fluoropolymer is dissolved to a concentration of 1-5% by weight in a perfluorinated solvent such as Fluorinert™ FC-75. The solution so formed is spin-coated onto a photoresist coated substrate to form a topcoat film of 50-300 nm thickness.

One of skill in the art will appreciate that the source of the 193 nm radiation, or radiation in the wavelength range of 170-260 nm, is not critical. ArF excimer lasers are convenient, controllable, high intensity sources of 193 nm radiation and are therefore preferred.

An example of a photolithographic process suitable for use with the fluids disclosed herein in an embodiment of the present invention is depicted in FIGS. 1 (4), 2 (5), and 3 (6). FIG. 1 shows a complete system, parts of which are advantageously disposed in a nitrogen dry box, 1, with an optical table, 2, mounted inside the dry box to accommodate optical components and a translating sample stage. A Scientech power meter, 3, is used to read the energy of the 193 nm laser light pulses emitted by an ArF excimer laser, 4. In the particular embodiment depicted in FIG. 4, the photolithographic exposure chamber is a low oxygen/low moisture nitrogen flushed dry-box (Nexus Dry Box, Vacuum Atmospheres Co., Hawthorne Calif. 90250-6896) adapted for use in the apparatus therein depicted. The 193 and 248 nm laser light is introduced into the dry box through an access port 5. A dry box control panel mounted internal oxygen and moisture analyzer, 6, is used to monitor the oxygen content in the dry box, and to indicate when oxygen concentration has decreased to acceptable levels after introduction of samples. Upon introduction into the dry box chamber, the laser beam 7 is reflected downwards by a fused silica beam splitter, 8, to the photoresist coated silicon wafer, 9. The photoresist coated wafer is contained in a machined aluminum wafer holder and immersed to a depth of about 1 mm in the immersion liquid. The whole plate can be translated under the laser beam to allow sequential exposures of different portions of the wafer, with differing exposure doses.

Figure 2:
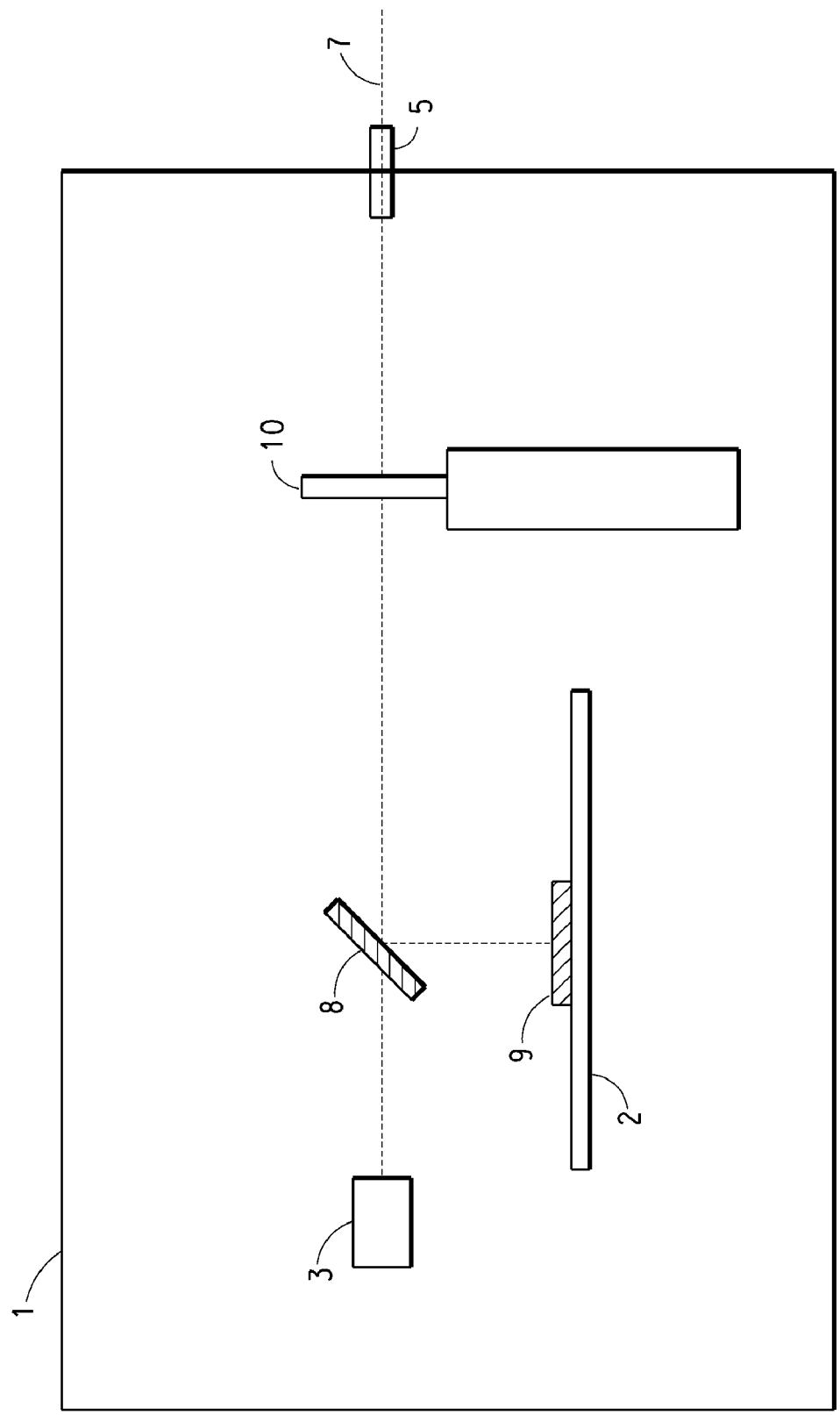

FIG. 2 shows more details of the optical exposure system of FIG. 1. The pulsed laser beam, 7, from the Excimer laser 4 enters the dry box, 1, at the access port, 5, goes through a manually operated shutter, 10, and is then incident on a fused silica beam splitter 8, that reflects a small portion of the laser energy down towards the photoresist coated silicon wafer 9 mounted on a translator that allows the sample to be translated under the laser beam. The majority of the laser beam continues through the beam splitter 8 and is then incident on a power meter head, 3.

FIG. 3 shows the wafer exposure stage, where the laser light, from the excimer laser hits the silicon wafer 11, in the machined aluminum plate 12 that moves under the laser beam along the translation stage on the optical table 2 of FIG. 1, so as to permit the sequential exposures, at various exposure doses. 13 is the N2 environment of the N2 dry box. 11 is the silicon wafer, which has been coated with a photosensitive photoresist polymer 14 as discussed in more detail below. Not shown is the topcoat layer as hereinabove discussed. Depicted in FIG. 3A is an embodiment of contact immersion photolithography at 193 nm exposure wavelength wherein a photomask 15 is placed on the surface of the photoresist polymer layer and the immersion liquid is introduced to cover the photoresist coated silicon wafer to a depth of approximately 1 mm 16. It has been found that when the photomask is small and light, as for example the metal grids used in the specific embodiments herein, it is convenient to introduce the immersion liquid first and then to position the photomasks in the fluid and on the surface of the photoresist coated silicon wafer. FIG. 3B depicts the same set-up but without the immersion liquid; FIG. 3B does not represent an embodiment of the present invention.

In another embodiment of the present invention, the photomask can be offset from the surface of the photoresist by a distance of about 10 μm. In a preferred embodiment of the present invention, in so called projection photolithography at 193 nm exposure wavelength, the photomask is disposed at some convenient location in the optical path, and the image is projected via a lens system, typically known as a projection lens, onto the photoresist. The projection system provides the highest resolution of the various embodiments of the present invention.

In another preferred embodiment of the process of the invention, projection photolithography at 193 nm exposure wavelength is employed. In this embodiment the output element of the projection lens—that end of the lens system closest to the photoresist surface—is disposed within the immersion liquid at a distance of about 0.5-5 mm from the photoresist surface, which is also immersed in the immersion liquid, the photoresist surface optionally having a topcoat 50-200 nm thick. In this embodiment the effective wavelength of the incident light is decreased, thereby increasing image resolution over that which can be attained in a gaseous atmosphere.

Thickness of the immersion liquid layer is determined by the details of the imaging system being developed or used. For example, in contact photolithography at 193 nm exposure wavelength a suitable thickness of the immersion liquid immersion layer is 1 mm. A 1 mm thickness may also be suitable for scanning or stepping the wafer under a projection lens, while maintaining sufficient distance between the output element of the projection lens and the wafer. One of skill in the art will appreciate that as the immersion liquid thickness is increased attenuation of the light will also increase, but tolerances in regard to the mechanics of stepping and scanning may become easier. Thinner immersion liquid layers may permit higher light exposure levels but the tolerances required for achieving scanning and/or stepping the wafer at high speed and with high accuracy may become excessively demanding.

The immersion liquid provides flexibility in system design, reducing the need to trade-off between the thickness of the immersion layer and mechanical design.

In a complete semiconductor manufacturing process, the photolithographic imaging and development of a photoresist layer, is performed many times in sequence, with a series of photomask patterns, and with various etch and deposition processes done between the sequential photolithographic steps.

The present invention provides a process comprising causing UV radiation having a wavelength from about 170 to about 260 nm to imagewise illuminate a target surface upon at least a portion of which surface is disposed a liquid comprising compound represented by the formula

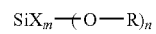

$$SiX_m-(O-R)_n$$

wherein X is halogen, n=1 to 4, m=4−n; and, R is cycloalkyl.

In some preferred embodiments, the light source emits light at 193 or 248 nm. More preferably the light source is a laser. In some highly preferred embodiments, the light source is an ArF excimer laser emitting light at 193 nm. Other suitable light sources include but are not limited to lamps such as gas discharge lamps of deuterium, xenon, or halogen, laser plasma light sources, and frequency shifted lasers, such as frequency doubled or tripled laser light sources.

Preferably the surface is a photoresist surface. More preferably the photoresist surface resides on a silicon wafer. Most preferably the photoresist surface is completely immersed in the liquid. It will be understood by one of skill in the art that the liquid may dissolve at least part of the photoresist surface. In such cases a protective topcoat can be applied to the resist. The topcoat is preferably optically uniform, transparent to 193 and 248 nm light, adherent to the resist, insoluble in the immersion liquid, and easily deposited and later removed in the process of immersion photolithography that leaves the underlying resist and the latent image in the resist (which is present in the resist after exposure and before development of the photoresist) undamaged.

Suitable topcoats include highly fluorinated polymers that are soluble in highly fluorinated solvents. Highly fluorinated solvents are an important element of the process of preparing a topcoat because they do not disturb most photoresist compositions. Suitable topcoat polymers include the homopolymer of perfluorobutenylvinyl ether {1,1,2,3,3,4,4-heptafluoro-4-[(trifluoroethenyl)oxy]-1-butene} or amorphous soluble copolymers of two or more monomers such as tetrafluoroethylene (TFE), hexafluoropropylene (HFP), perfluorodimethyldioxole[4,5-difluoro-2,2-bis(trifluoromethyl)-1,3-dioxlole], and perfluoro alkyl vinyl ethers such as perfluoromethylvinyl ether and perfluoropropylvinylether. The recited copolymers may also include small amounts of termonomers including vinylidene fluoride, vinyl fluoride, trifluoroethylene, 3,3,3-trifluoropropene, 3,3,3,2-tetrafluoropropene, and hexafluoroisobutylene[3,3,3-trifluoro-2-(trifluoromethyl)propene], but not so much of these monomers that the polymers are no longer soluble in the desired highly fluorinated solvents. Preferred fluorinated solvents include Fluorinert™ FC-75, Fluorinert™ FC-40, Performance Fluid™ PF-5080, perfluorobutyltetrahydrofuran, perfluorotributylamine, perfluorooctane, perfluoroalkanes, and perfluorodecahydronapthalene. Preferred topcoat polymers are Teflon™ AF, available from the DuPont Company, Wilmington Del., Cytop™, 40-60:60:40 poly(hexafluoropropylene: tetrafluoroethylene), and poly(perfluorodimethyldioxole: perfluoropropylvinyl ether).

EXAMPLES

Refractive index data is summarized in Table 1.

Example 1

Under nitrogen, a 500 mL round bottom flask equipped with a magnetic stirbar was charged with a solution of $SiCl_4$ (4.00 g, 23.5 mmol) dissolved in toluene (250 mL). A cis/trans-mixture of 99% 4-methylcyclohexanol (10.75 g, 94.2 mmol) was added dropwise, followed by dropwise addition of pyridine (7.45 g, 94.2 mmol). Pyridinium hydrochloride precipitated during the addition of pyridine. The reaction mixture was heated to 50° C. and stirred for 1 h, allowed to cool, and then stirred overnight at room temperature. The reaction mixture was filtered and the colorless filtrate concentrated to dryness under vacuum to afford an oil. The oil was distilled under high vacuum to afford 6.0 g of $Si(O-4-C_6H_{10}—CH_3)_4$ as colorless oil (b.p. 150-167° C., <1 millitorr). $^1H$ NMR ($CD_2Cl_2$) δ 4.2, 3.8 (mult's, 4H, OCH), 1.9-0.8 (mult's, 48H).

A vial containing $Si(O-4-C_6H_{10}—CH_3)_4$ and activated carbon was rolled overnight. The mixture was then filtered through a 0.2 micron syringe filter and the refractive index at 193 nm was determined to be 1.610.

Example 2

Synthesis of $Si(OC_6H_{11})_3Cl$

Under nitrogen, a 500 mL round bottom flask equipped with a magnetic stirbar was charged with a solution of $SiCl_4$ (4.00 g, 23.5 mmol) dissolved in toluene (250 mL). To this solution was added cyclohexanol (7.07 g, 70.6 mmol) dropwise, followed by dropwise addition of pyridine (5.59 g, 70.6 mmol). Pyridinium hydrochloride precipitated during the addition of pyridine. The reaction mixture was heated to 50° C. and stirred for 1 h, allowed to cool, and then stirred overnight at room temperature. The reaction mixture was filtered and the colorless filtrate concentrated to dryness under vacuum to afford an oil. The oil was distilled under high vacuum (bp 110-117° C., <1 millitorr) to afford 6.1 g of $Si(OC_6H_{11})_3Cl$ as a colorless oil contaminated by trace amounts of $Si(OC_6H_{11})_2Cl_2$ and $Si(OC_6H_{11})_4$. $^1H$ NMR ($CD_2Cl_2$) δ 3.9 (mult, 3H, OCH), 1.8-1.1 (mult, 30H). $^{29}Si$ NMR ($C_6D_6$) δ −74.8.

TABLE 1

Refractive Index Data

| Compound | refractive index @ 193 nm | Reference Material | refractive index @ 589 nm |
|---|---|---|---|
| 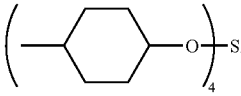 | 1.610 | 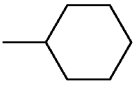 | Unknown, but about likely 1.56-1.57 |
| 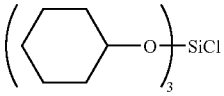 | 1.617 | $SiCl_4$ | 1.556 |
|  |  | 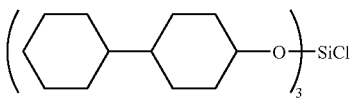 | 1.571 |
| 75 wt %  25 wt % 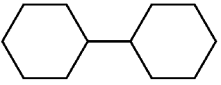 | 1.663/1.661 | 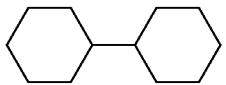 | 1.649 |

A vial containing Si(OC$_6$H$_{11}$)$_3$Cl and activated carbon was rolled overnight. The mixture was then filtered through a 0.2 micron syringe filter and the refractive index at 193 nm was 1.617. Absorbance at 193 nm was 24.3 cm$^{-1}$.

Example 3

Synthesis of Si(O-4-C$_6$H$_{10}$—C$_6$H$_{11}$)$_3$Cl

Under nitrogen, a 250 mL round bottom flask equipped with a magnetic stirbar was charged with a solution of SiCl$_4$ (1.30 g, 7.65 mmol) dissolved in toluene (100 mL). Cis/trans-4-cyclohexyl-cyclohexanol (4.18 g, 22.95 mmol) was added by spatula, followed by dropwise addition of pyridine (1.81 g, 22.95 mmol). Pyridinium hydrochloride precipitated during the addition of pyridine. The reaction mixture was heated to 50° C. and stirred for 1 h, allowed to cool, and then stirred overnight at room temperature. The reaction mixture was filtered and the colorless filtrate concentrated to dryness under vacuum to afford an oil. The crude product was dissolved in pentane, filtered, and concentrated to dryness; this process was then repeated a second time. The product was then dried overnight under high vacuum to afford Si(O-4-C$_6$H$_{10}$—C$_6$H$_{11}$)$_3$Cl as a very viscous, slightly cloudy, colorless oil. $^1$H NMR (CD$_2$Cl$_2$) δ4.2, 3.7 (mults, 4H, OCH), 1.9-0.9 (mults, 80H). $^{29}$Si NMR (CD$_2$Cl$_2$) δ −74.8.

A 75 wt. % solution of Si(O-4-C$_6$H$_{10}$—C$_6$H$_{11}$)$_3$Cl and 25% bicyclohexyl was contacted with activated carbon and rolled overnight. It was then filtered through a 0.2 micron syringe filter and the refractive index at 193 nm was determined to be 1.663. Another sample prepared similarly had a refractive index at 193 nm of 1.661.

Example 4

Purification of the 75 wt. % Solution of Si(O-4-C$_6$H$_{10}$—C$_6$H$_{11}$)$_3$Cl and 25% Bicyclohexyl of Example 3

Type 3 A molecular sieves are dried for two hours under air at 350° C. About 10 grams of the so dried sieves are mixed with 20 ml of the 75 wt. % solution of Si(O-4-C$_6$H$_{10}$—C$_6$H$_{11}$)$_3$Cl and 25% bicyclohexyl of Example 3. The molecular sieves are filtered out under N2 in a glove box.

Type 3, 8 mesh silica gel (Aldrich catalog number 24,982-3) is dried at 500° C. for two hours under air. About 10 mL of the so dried silica gel is added to 20 ml of the molecular sieve-treated 75 wt. % solution of Si(O-4-C$_6$H$_{10}$—C$_6$H$_{11}$)$_3$Cl and 25% bicyclohexyl. The silica gel is filtered out under N$_2$ in a glove box.

Example 5

Synthesis of Si(OCH$_2$C$_4$H$_7$)$_4$

Under nitrogen, a 250 mL round bottom was charged with a solution of SiCl$_4$ (5.0 g, 29.4 mmol) dissolved in toluene (100 mL). To this was added cyclobutanemethanol (10.1 g, 117.7 mmol) dropwise followed by pyridine (9.3 g, 117.7 mmol) dropwise. A white precipitate formed. The reaction mixture was heated to 50° C. and stirred for 1 h; it was then cooled to room temperature and stirred overnight. It was then filtered and the colorless filtrate concentrated under vacuum to afford an oil. The oil was distilled using a shortpath distillation apparatus (bp 125-140° C. @ 75-100 millitorr) affording 9.1 g of Si(OCH$_2$Cyclobutyl)$_4$ as a colorless oil. $^1$H NMR (CD$_2$Cl$_2$) δ3.68 (8H, s, OCH$_2$), 2.45 (4H, mult, OCH$_2$CH), 1.95-1.65 (24H, mult, CH$_2$CH$_2$CH$_2$).

5.1 g of the above material was contacted with activated carbon and rolled overnight. It was then filtered through a 0.2 micron syringe filter and the refractive index at 193 nm was determined to be 1.615 and its absorbance at 193 nm was 4.865 cm$^{-1}$. The index of refraction of this material at 589 nm was determined to be 1.463.

Example 6

Synthesis of Si(OC$_4$H$_7$)$_4$

Under nitrogen, a 250 mL round bottom was charged with a solution of SiCl$_4$ (2.95 g, 17.3 mmol) dissolved in toluene (100 mL). To this was added cyclobutanol (5.00 g, 69.3 mmol) dropwise followed by pyridine (5.48 g, 69.3 mmol) dropwise. A white precipitate formed. The resulting reaction mixture was heated to 50° C. and stirred for 1 h. It was then filtered and the resulting filtrate concentrated under vacuum to afford an oil. The oil was distilled using a shortpath distillation apparatus (bp 99-106° C. @ 70-80 millitorr) affording 3.9 g of Si(OCyclobutyl)$_4$ as a colorless oil. $^1$H NMR (CD$_2$Cl$_2$) δ4.35 (4H, mult, OCH), 2.25 (mult, 8H, CH$_2$), 1.98 (mult, 8H, CH$_2$), 1.65 (mult, 4H, CHH'), 1.40 (mult, 4H, CHH').

3.3 g of the above material was contacted with activated carbon and rolled overnight. It was then filtered through a 0.45 micron syringe filter and the refractive index at 193 nm was determined to be 1.605 and its absorbance at 193 nm was 47 cm$^{-1}$. The index of refraction of this material at 589 nm was determined to be 1.459.

Apparatus

The apparatus for performing contact photolithography at 193 nm is depicted in FIG. 2(5). It consists of a al 193 nm Lambda-Physik (Ft. Lauderdale, Fla.) Optex ArF Excimer laser light source, a model D200 Scientech (5649 Arapahoe Avenue, Boulder, Colo. 80303) laser power meter, and an immersion liquid reservoir, all mounted on a 24" (61 cm)×18" (46 cm) optical table (Newport Corp., Irvine Calif.), positioned in a nitrogen flushed Nexus Dry Box (VAC Industries, Hawthorne Calif.) equipped with a trace oxygen analyzer and moisture probe (VAC Industries).

Test specimens are submerged 1 mm deep in the 75 wt. % solution of Si(O-4-C$_6$H$_{10}$—C$_6$H$_{11}$)$_3$Cl and 25% bicyclohexyl in the reservoir as shown in FIG. 3A(6A). The laser beam traverses a distance of approximately 12" before being directed vertically downward towards the target surface as shown in FIGS. 1(4) and 1(5). The target surface is a 100 mm diameter×0.5 mm thick silicon wafer mounted in an aluminum holder. The holder is mounted on a rail so that the sample assembly can be translated horizontally. A manually controlled shutter is placed in the beam path as shown. The Scientech power meter, as shown, is used to measure the total exposure energy per unit area. After monitoring a consistent energy of typically 0.2 milliJoules per cm2, the sample holder is slid into place.

Immersion liquid is dispensed into the reservoir of FIG. 6 using a glass hypodermic syringe, (Popper & Sons inc., New Hyde Park N.Y.) with a chrome Luer-Lock tip. Attached to the tip is a 0.2 micrometer PTFE membrane syringe filter, (Pall Gelman Laboratory, Ann Arbor, Mich.)

Wafer Preparation

Single crystal silicon wafers, (Wafernet, Inc., San Jose Calif., 100 mm diameter×0 5 mm thick, polished on one side and having a natural oxide layer, approximately 2 nm thick, are prepared for 193 nm photolithography using the following procedure. The silicon wafers are coated in a YES-3 Vapor-Prime Oven (Yield Engineering Company, San Jose Calif.), with a layer of hexamethyldisilizane (HMDS) (Arch Chem. Ind, Norwalk, Conn.) used as an adhesion promoter for the photoresist.

The wafer is spin-coated with a photoresist polymer using a CEE Model 100CB Spinner/Hotplate, (Brewer Science Inc., Derby England). The photoresist is a terpolymer of 1) tetrafluoroethylene (TFE), 2) a norbornene fluoroalcohol (NBFOH), and 3) t-butyl acrylate (t-BAc) as represented by the structure

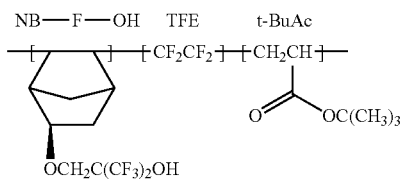

The polymer is prepared by free radical solution polymerization using peroxydicarbonate initiator and a hydrofluorocarbon solvent, as described in A. E. Feiring et al., "Design of Very Transparent Fluoropolymer Resists for Semiconductor Manufacture at 157 nm" Journal of Fluorine Chemistry, 122, 11-16, (2003). The photoresist polymer composition is 33% TFE, 43% NBFOH and 24% t-BA. The spinning solution for the formulated photoresist consists of a 15 weight percent photoresist polymer dissolved in a 2-heptanone solvent with an additional 2 wt % of triphenylsulfonium nonaflate (TPS-Nf) present to serve as the photoacid generator (PAG) and 0.2 wt % of tetrabutylammonium lactate (TBALac) to serve as the contrast enhancing base additive The weight percent is by weight of the total, including the weight of the spinning solvent. For details of this resist formulation and processing see M. K. Crawford et al., "Single Layer Fluoropolymer Resists for 157 nm Photolithography at 157 nm exposure wavelength", Advances in Resist Technology and Processing XVIII, SPIE Vol. 5039, (2003), and also A. E. Feiring et al., op. cit.

Approximately 1 ml of the photoresist solution so prepared is dispensed through a 0.2 micrometer polytetrafluoroethylene syringe filter onto the HMDS vapor primed coated wafer and the wafer is spun-coated at 2500 rpm for 60 seconds in air and then a post apply bake (PAB) of the resist is done at 150° C. for 60 seconds. The photoresist films are visually inspected and the thickness of each film measured using a FilMetrics film thickness instrument (Filmetrics Inc., San Diego Calif.).

1 ml of Teflon™ AF is dispensed onto the photoresist-coated wafer and the wafer is spun at 2500 rpm for 1 minute. The sample is then transferred into the VAC Dry Box and placed into the sample holder.

Imagewise Exposure

A contact mask is formed using SPI Copper TEM Grids, (SPI Inc. West Chester Pa.), 3 mm diameter×50 mesh, with a lateral periodicity of 500 micrometers, and line widths of 100 microns by placing the grids end to end across the entire wafer in the beam exposure path. The photoresist coated wafer is immersed to a fluid depth of approximately 1 mm by dispensing approximately 20 milliters of the immersion liquid through a glass syringe with a 0.2 micron filter over the entire 100 mm diameter of the top coat/photoresist/HMDS primed silicon wafer.

Sequential exposure is affected by physically translating the wafer into the exposure zone by ½ cm increments along a slide rail mounted on the optical table thereby providing a series of ½ cm strips of increasing dosage. After exposure the alkane immersion liquid of the invention is pipetted off and the contact masks are removed. The exposed wafer is then transferred out of the VAC Dry Box and post exposure baked at 135° C. for 60 seconds in air on the CEE Model 100CB Hotplate. The Top Coat is then removed from the wafer by spin cleaning on the CEE Model 100CB spinner, by dispensing FC-75 solvent over the top surface of the wafer, then spinning the wafer at 2500 rpm for 60 seconds in air. The thus exposed photoresist is then developed using Shipley LDD-26W Developer (Shipley Company, L.L.C., Marlborough Mass.), by immersion in the developer for 60 seconds at room temperature, in air. Then the sample is immersed in deionized (D.I.) water for 10 to 15 seconds, removed from the water bath, rinsed with a D.I. water spray and blown dry with nitrogen gas.

The dried samples are visually and microscopically inspected to determine the contact print dose, E1 Dry, which refers to the minimum exposure energy required for image formation in the absence of an immersion liquid; and to determine the contact print dose E1 Wet which refers to the minimum exposure energy required for image formation in the presence of a given immersion liquid.

The photoresist layer prepared as described in the foregoing is 270 nm thick. The photoresist layer is coated with a topcoat as described above. The topcoat solution is prepared by combining 4.1 wt-% Teflon™ AF 1601 in FLUORI-NERT™ FC-75. The topcoat layer so prepared is 70 nm thick. The A 75 wt. % solution of $Si(O-4-C_6H_{10}-C_6H_{11})_3Cl$ and 25% bicyclohexyl is used as the immersion liquid. The copper TEM grid pattern is clearly transferred to the silicon wafer.

What is claimed is:

1. A process comprising causing UV radiation having a wavelength from about 170 to about 260 nm to imagewise illuminate a target surface upon at least a portion of which surface is disposed a liquid comprising compound represented by the formula

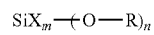

wherein X is halogen, n =1 to 4, m =4−n; and, R is cycloalkyl.

2. An apparatus comprising a light source capable of emitting light having a wavelength from about 170 to about 260 nm, a surface disposed so that upon activation of the light source said surface is imagewise illuminated by the light emitted from the light source, wherein upon at least a portion of said surface is disposed a liquid comprising compound represented by the formula

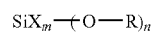

wherein X is halogen, n =1 to 4, m =4−n; and, R is cycloalkyl.

* * * * *